(12) United States Patent
Jung et al.

(10) Patent No.: US 12,223,993 B2
(45) Date of Patent: Feb. 11, 2025

(54) CONTENT ADDRESSABLE MEMORY BASED ON SELFRECTIFYING FERROELECTRIC TUNNEL JUNCTION ELEMENT

(71) Applicant: INDUSTRY-ACADEMIC COOPERATION FOUNDATION, YONSEI UNIVERSITY, Seoul (KR)

(72) Inventors: Seong Ook Jung, Seoul (KR); Se Hee Lim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 402 days.

(21) Appl. No.: 17/933,093

(22) Filed: Sep. 17, 2022

(65) Prior Publication Data

US 2023/0086821 A1 Mar. 23, 2023

(30) Foreign Application Priority Data

Sep. 17, 2021 (KR) .......................... 10-2021-0124496

(51) Int. Cl.
*G11C 11/22* (2006.01)
*G11C 15/04* (2006.01)

(52) U.S. Cl.
CPC ...... *G11C 11/2275* (2013.01); *G11C 11/2255* (2013.01); *G11C 11/2297* (2013.01); *G11C 15/04* (2013.01)

(58) Field of Classification Search
CPC ............ G11C 11/2275; G11C 11/2255; G11C 11/2297; G11C 15/04
USPC ......................................................... 365/145
See application file for complete search history.

(56) References Cited

U.S. PATENT DOCUMENTS

2021/0050060 A1* 2/2021 Li .......................... G11C 7/1006
2023/0090194 A1* 3/2023 Tseng .................. G11C 16/0466
365/185.24

FOREIGN PATENT DOCUMENTS

KR 10-2019-0114919 A 10/2019

OTHER PUBLICATIONS

Ismail Bayram et al., 'NV-TCAM: Alternative designs with NVM devices', Intergration the VLSI Journal 62 (2018) 114-112 (Feb. 16, 2018).

* cited by examiner

*Primary Examiner* — Connie C Yoha

(57) ABSTRACT

A content addressable memory based on a self-rectifying ferroelectric tunnel junction element comprises: a cell array unit having a plurality of TCAM cells, each comprising two self-rectifying ferroelectric tunnel junction elements (SR-FTJ) connected between a corresponding match line of a plurality of match lines extending in a first direction and a corresponding bit line pair of a plurality of bit line pairs extending in a second direction; a precharge unit precharging a corresponding match line of the plurality of match lines to a power supply voltage level in response to a precharge signal; and a data input/output unit having a plurality of access transistor pairs electrically connecting or disconnecting a corresponding bit line pair among the plurality of bit line pairs and a source line, in response to a voltage applied through a corresponding search line pair among a plurality of search line pairs according to data to be written or searched.

13 Claims, 8 Drawing Sheets

CONTENT ADDRESSABLE MEMORY BASED ON SELFRECTIFYING FERROELECTRIC TUNNEL JUNCTION ELEMENT

CROSS-REFERENCE TO RELATED APPLICATIONS

This application claims priority under 35 U.S.C. § 119(a) to Korean Patent Application No. 10-2021-0124496, filed on Sep. 17, 2021, in the Korean Intellectual Property Office, the disclosure of which is incorporated herein in its entirety by reference.

BACKGROUND

1. Technical Field

The present disclosure relates to a content addressable memory, more particularly to a content addressable memory based on a self-rectifying ferroelectric tunnel junction element.

2. Description of the Related Art

A content addressable memory (hereinafter, CAM) is a memory having a plurality of CAM cells to store data, and refers to a memory configured to receive data as an input and output an address in which the received data is stored. CAM is used in various applications requiring high-speed search, such as a search engine in a network router, an image process, or a neural network.

The CAM may be divided into a binary CAM and a ternary CAM (hereinafter, TCAM) according to a data storage method. The binary CAM is configured such that each CAM cell can store state information of one of two states: a logic "1" state and a logic "0" state. On the other hand, the TCAM is configured such that it can additionally store an "X" (don't care) state, in addition to a logic "0" state and a logic "1" state. The TCAM has an advantage that it can provide flexibility of a search by allowing an "X" state to be additionally stored.

Conventionally, CAM has been implemented with a CMOS which is a volatile element, or with an MTJ (Magnetic Tunnel Junction) or ReRAM (Resistive RAM) or the like which is a non-volatile element. Since the CAM implemented with a CMOS requires each cell to have a plurality of transistors (e.g. 16T), there is a limitation in that not only does it require a large area, but data is lost if power is not applied. In addition, in the case of the MTJ CAM, there is a problem that it requires a smaller number of transistors (10T-4MTJ) than CMOS, but still requires a large number of elements, and the search accuracy is low due to the characteristics of MTJ element with a low on/off ratio. The ReRAM CAM can significantly reduce the number of elements compared to MTJ CAM, but has a problem that the on/off ratio is low like the MTJ CAM.

Accordingly, there is a continuous demand for a CAM that can be highly integrated in a small area with a small number of elements and has high search accuracy.

SUMMARY

An object of the present disclosure is to provide a content addressable memory that can be implemented in a compact size by high integration in a small area with a small number of elements.

Another object of the present disclosure is to provide a content addressable memory capable of performing an accurate search with low power using a self-rectifying ferroelectric tunnel junction element with a high on/off ratio.

A content addressable memory according to an embodiment of the present disclosure, conceived to achieve the objectives above, comprises: a cell array unit having a plurality of TCAM cells, each comprising two self-rectifying ferroelectric tunnel junction elements (hereinafter, SR-FTJ) connected between a corresponding match line of a plurality of match lines extending in a first direction and a corresponding bit line pair of a plurality of bit line pairs extending in a second direction intersecting the first direction; a precharge unit precharging a corresponding match line of the plurality of match lines to a power supply voltage level in response to a precharge signal; and a data input/output unit having a plurality of access transistor pairs electrically connecting or disconnecting a corresponding bit line pair among the plurality of bit line pairs and a source line, in response to a voltage applied through a corresponding search line pair among a plurality of search line pairs according to data to be written or searched.

Each of the plurality of TCAM cells may include: a first SR-FTJ connected between a corresponding match line and a bit line bar of a corresponding bit line pair; and a second SR-FTJ connected between a corresponding match line and a bit line of a corresponding bit line pair.

In each of the plurality of TCAM cells, when data "0" is stored by a write operation, the first SR-FTJ may have a low resistance state (LRS) and the second SR-FTJ may have a high resistance state (HRS), and when data "1" is stored, the first SR-FTJ may have a high resistance state and the second SR-FTJ may have a low resistance state, and when data "X" (don't care) is stored, both the first and second FeFETs may have a high resistance state.

Each of the plurality of access transistor pairs may include: a first access transistor connected between a bit line bar of a corresponding bit line pair and the source line and having a gate connected with a search line of a corresponding search line pair; and a second access transistor connected between a bit line of a corresponding bit line pair and the source line and having a gate connected with a search line bar of a corresponding search line pair.

In a $1^{st}$ phase of a write operation divided into the $1^{st}$ phase and a $2^{nd}$ phase, the TCAM may select a match line corresponding to an address applied together with data and apply a voltage of $-V_W/2$ based on a write voltage ($V_W$), and apply a ground voltage to unselected match lines, and apply a voltage of $V_W/2$ to the source line, so that the first SR-FTJ or the second SR-FTJ of the TCAM cell corresponding to the selected match among the plurality of TCAM cells may have a high resistance state according to a voltage level applied through a corresponding search line pair.

In the TCAM, when a ground voltage and a voltage of $V_W/2$ are respectively applied to a search line and a search line bar of a corresponding search line pair among the plurality of search line pairs, the second SR-FTJ of a corresponding TCAM cell of a plurality of TCAM cells connected to the selected match line may have a high resistance state, when a voltage of $V_W/2$ and a ground voltage are respectively applied to the search line and the search line bar of a corresponding search line pair, the first SR-FTJ of the corresponding TCAM cell connected to the selected match line may have a high resistance state, and when a voltage of $V_W/2$ is applied to each of the search line and the search line bar of a corresponding search line pair, the first SR-FTJ of the corresponding TCAM cell connected to the selected match line may have a high resistance state.

In the $2^{nd}$ phase of the write operation, the TCAM may apply a voltage of $V_W/2$ to a selected match line, a ground voltage to unselected match lines, and a voltage of $-V_W/2$ to the source line, so that the first SR-FTJ or the second SR-FTJ of the TCAM cell corresponding to the selected match among the plurality of TCAM cells may have a low resistance state according to a voltage level applied through a corresponding search line pair.

In the TCAM, when a ground voltage and a voltage of $-V_W/2$ are respectively applied to the search line and the search line bar of a corresponding search line pair, the first SR-FTJ of a corresponding TCAM cell of a plurality of TCAM cells connected to the selected match line may have a low resistance state, and when a voltage of $-V_W/2$ and a ground voltage are respectively applied to the search line and the search line bar of a corresponding search line pair, the second SR-FTJ of the corresponding TCAM cell connected to the selected match line may have a low resistance state.

To the first and second SR-FTJs of the plurality of TCAM cells, in the $1^{st}$ phase of the write operation, a ground voltage may be applied as a body voltage, and in the $2^{nd}$ phase, a voltage of $-V_W/2$ may be applied.

The precharge unit may include a plurality of precharge transistors connected between a power supply voltage and a corresponding match line of the plurality of match lines and receiving the precharge signal through gates.

Each of the plurality of precharge transistors, in a precharge phase of a search operation, which is divided into a precharge phase and an evaluation phase, may be turned on in response to the precharge signal activated to a ground voltage level to precharge a corresponding match line among the plurality of match lines to a power supply voltage level, and in the write operation and the evaluation phase, may be turned off in response to the precharge signal deactivated to a power supply voltage level.

In the precharge phase, the TCAM may apply a power supply voltage to the source line and the search line and the search line bar of each of the plurality of search line pairs, thereby precharging bit line bars and bit lines of the plurality of bit line pairs to a power supply voltage level.

In the evaluation phase, the TCAM may apply a ground voltage to the source line, and if the data to be searched is "0", the ground voltage and the power supply voltage may be applied to the search line and the search line bar, respectively, and if the data to be searched is "1", the power supply voltage and the ground voltage may be applied to the search line and the search line bar, respectively.

Accordingly, the content addressable memory based on a self-rectifying ferroelectric tunnel junction element according to an embodiment of the present disclosure can constitute a content addressable memory cell with only two self-rectifying ferroelectric tunnel junction elements, so it can be manufactured in a very small size by being highly integrated in a very small area, and it is possible to significantly reduce the energy consumed in the search and also to have high search accuracy.

DETAILED DESCRIPTION

Figure 1A:
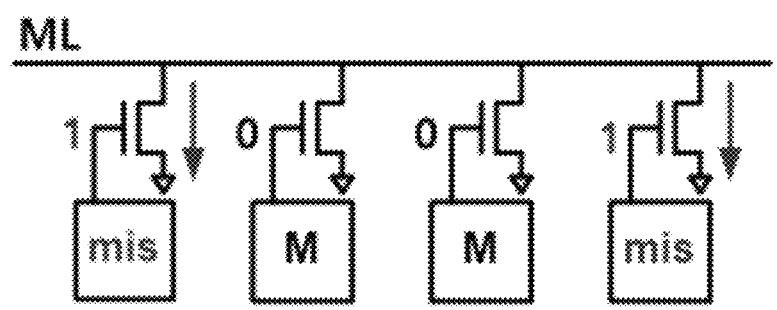
FIG. 1A and FIG. 1B are diagrams for explaining NOR type and NAND type search operations of a CAM.

In order to fully understand the present disclosure, operational advantages of the present disclosure, and objects achieved by implementing the present disclosure, reference should be made to the accompanying drawings illustrating preferred embodiments of the present disclosure and to the contents described in the accompanying drawings.

Hereinafter, the present disclosure will be described in detail by describing preferred embodiments of the present disclosure with reference to accompanying drawings. However, the present disclosure can be implemented in various different forms and is not limited to the embodiments described herein. For a clearer understanding of the present disclosure, parts that are not of great relevance to the present disclosure have been omitted from the drawings, and like reference numerals in the drawings are used to represent like elements throughout the specification.

Throughout the specification, reference to a part "including" or "comprising" an element does not preclude the existence of one or more other elements and can mean other elements are further included, unless there is specific mention to the contrary. Also, terms such as "unit", "device", "module", "block", and the like described in the specification refer to units for processing at least one function or operation, which may be implemented by hardware, software, or a combination of hardware and software.

Figure 1B:
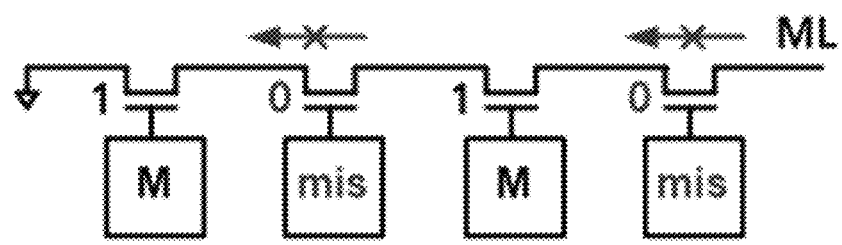

FIG. 1A and FIG. 1B are diagrams for explaining NOR type and NAND type search operations of a CAM.

FIG. 1A shows a search operation of a NOR type CAM, and FIG. 1B shows a search operation of a NAND type CAM. As shown in FIG. 1A and FIG. 1B, the CAM is a memory that searches a memory cell in which applied data is stored and outputs an address, and is divided into a NOR type and a NAND type according to a search operation method.

In the case of the NOR type shown in FIG. 1A, each of the plurality of CAM cells is configured such that the current of the match line (ML) flows to the ground in a parallel connection method according to whether stored data and applied data match. Accordingly, in the NOR type, even if a mismatch occurs in one CAM cell, a current flows, thereby indicating a fast search speed, but energy consumption is large.

On the other hand, in the case of the NAND type shown in FIG. 1B, each of the plurality of CAM cells is configured such that the current of the match line (ML) flows to the ground in a series connection manner according to whether stored data and applied data match. Accordingly, it is configured such that the current of the match line (ML) flows to the ground only when a match is made in all CAM cells connected to the same match line (ML). Accordingly, the NAND type has the advantage of low energy consumption because current does not flow even if a mismatch occurs in only one cell, however there is a disadvantage in that the search speed is slow as the discharge path of the match line (ML) is configured in series.

As described above, in the CAM, both the NOR type and the NAND type have advantages and disadvantages, so the NOR type or the NAND type is selectively used according to the purpose of using the CAM.

FIG. 2A to FIG. 2D are diagrams for explaining characteristics of a ferroelectric tunnel junction element.

Figure 2A:
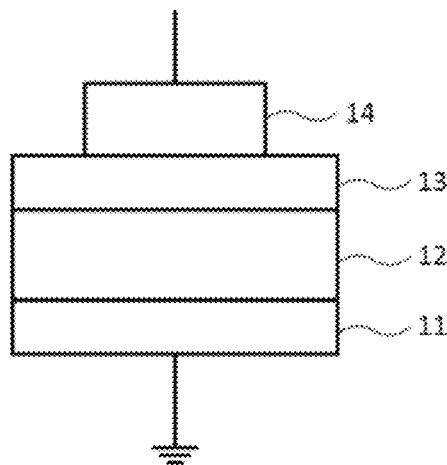
FIG. 2A to FIG. 2D are diagrams for explaining characteristics of a ferroelectric tunnel junction element.
Figure 2B:
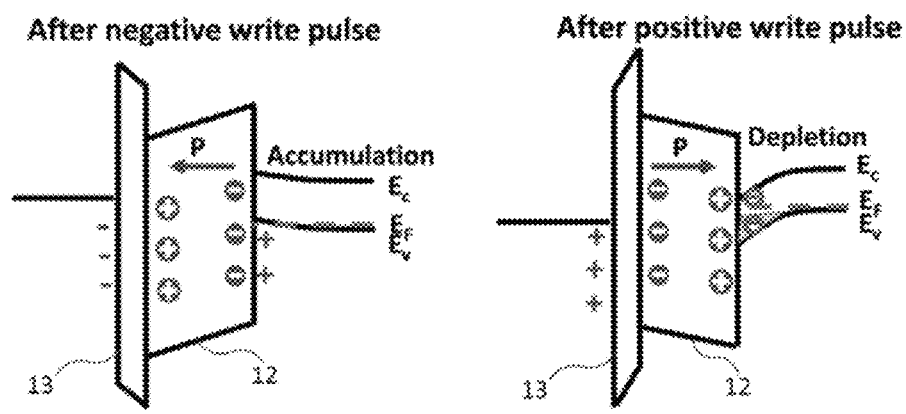
Figure 2C:
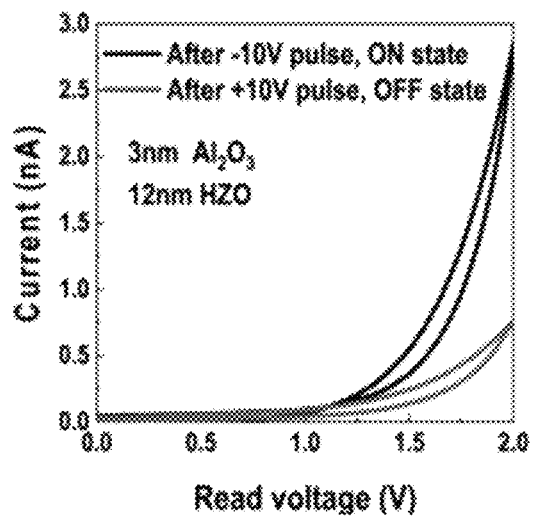
Figure 2D:
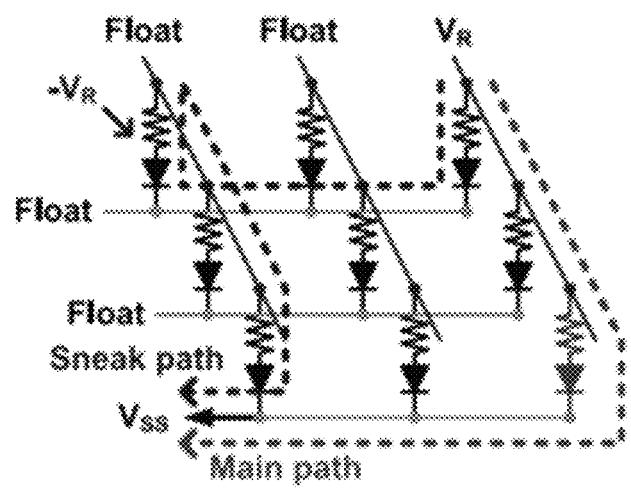

FIG. 2A shows a structure of a ferroelectric tunnel junction element (hereinafter, FTJ), FIG. 2B shows a state according to a polarization of the FTJ, and FIG. 2C shows a current voltage graph of the FTJ. In addition, FIG. 2D is a diagram for explaining the sneak current path according to the characteristics of the FTJ element.

As shown in FIG. 2A, the FTJ may be formed, for example, in a structure in which a ferroelectric tunnel layer 12, a ferroelectric layer 13 and a metal layer 14 are sequentially stacked on a semiconductor layer 11. For example, the semiconductor layer 11 may be formed of P-type silicon (P type Si), the ferroelectric tunnel layer 12 may be formed of zirconium (Zr) doped with hafnium oxide ($HfO_2$), the ferroelectric layer 13 may be implemented with aluminum oxide ($Al_2O_3$), and the metal layer 14 may be formed of titanium (Ti) or aluminum (Al).

In such an FTJ, polarization of the ferroelectric layer 13 is formed in different directions depending on whether a negative write voltage ($-V_W$) is applied as shown on the left side of (b) or a positive write voltage ($V_W$) is applied as shown on the right side of (b), so that the FTJ becomes a low resistance state (LRS) or a high resistance state (HRS).

Accordingly, when a negative write voltage ($-V_W$) is applied and the FTJ has a low resistance state (LRS), as shown in the black line in the graph of (c) the current flows well at the read voltage of a voltage level lower than the write voltage ($V_W$), which can be viewed as a switched-on state. On the other hand, when a positive write voltage ($V_W$) is applied and the FTJ has a high resistance state (HRS), as shown in the red line the positive write voltage ($V_W$) is applied and the current does not flow well at the read voltage, so it can be viewed as a switched-off state.

Such an FTJ can be used as a switch element or a memory element in which the low resistance state (LRS) represents a logic "1" (Logic 1) and the high resistance state (HRS) represents a logic "0" (Logic 0).

In the above, it is assumed that the semiconductor layer 11 is formed in a P-type. If the semiconductor layer 11 is formed in an N-type, the FTJ may have a high resistance state (HRS) of logic "0" when a negative write voltage ($-V_W$) is applied, and may have a low resistance state (LRS) of logic "1" when a positive write voltage ($V_W$) is applied.

However, since such an FTJ is a bidirectional switch element that allows current to flow in both directions depending on the voltage applied to both ends, when a memory array is configured using an FTJ, as shown in (d), there is a problem that a sneak current may flow because a current path is formed in an unintentional path during a read operation. For this reason, previously there was a limit to the use of the FTJ for a memory device or a CAM.

Figure 3A:
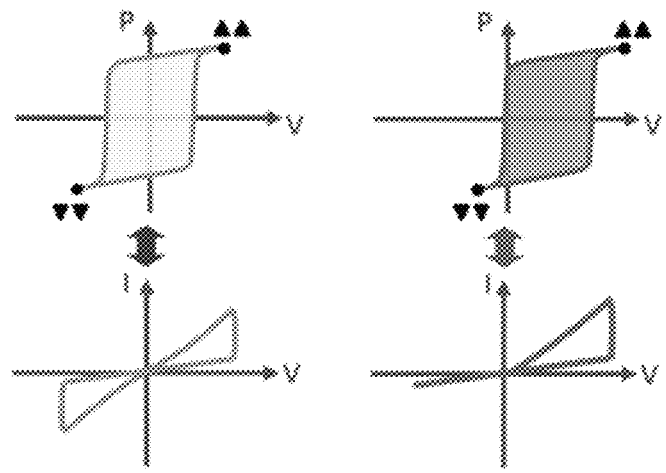
FIG. 3A and FIG. 3B are diagrams for explaining characteristics of a self-rectifying ferroelectric tunnel junction element.
Figure 3B:
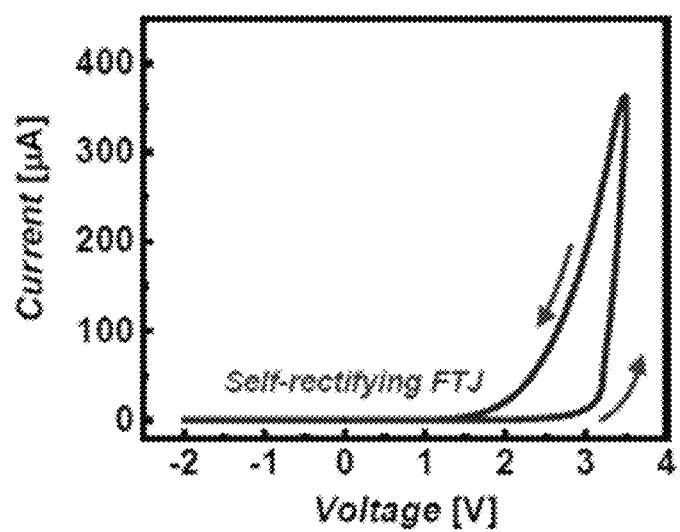

FIG. 3A and FIG. 3B are diagrams for explaining characteristics of a self-rectifying ferroelectric tunnel junction element.

In order to solve the problem caused by the above-described bidirectional characteristic of the FTJ, recently, a self-rectifying ferroelectric tunnel junction element (hereinafter, SR-FTJ) has been developed in which the above-described FTJ is adjusted to have unidirectional characteristics rather than bidirectional characteristics. The SR-FTJ can be implemented by adjusting the polarization characteristics according to voltage according to the elements constituting the semiconductor layer 11, the ferroelectric tunnel layer 12, the ferroelectric layer 13 and the metal layer 14, and the doping level, etc.

The left and right graphs in FIG. 3A show voltage-polarization (V-P) characteristic curves and voltage-current (I-V) characteristic curves of the conventional FTJ and SR-FTJ, respectively. In the case of the conventional FTJ, as shown on the left, since the polarization (P) according to the voltage (V) is made not only at the positive voltage but also at the negative voltage, the voltage-current (I-V) characteristic curve also has a bidirectional characteristic. In contrast, in the case of SR-FTJ, as shown on the right, since the polarization (P) according to the voltage (V) is made only at the positive voltage, as shown in the enlarged graph in FIG. 3B it can be seen that the voltage-current (I-V) characteristic curve has a unidirectional characteristic. This indicates that the SR-FTJ has a rectifying characteristic similar to that of a diode, so it can prevent reverse current flow.

Figure 4:
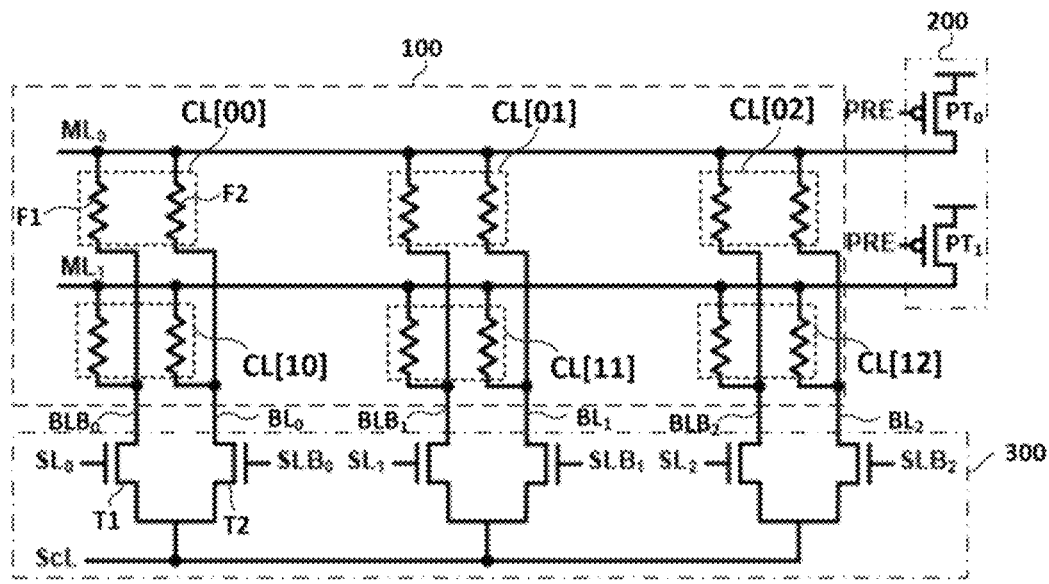
FIG. 4 shows a TCAM structure according to an embodiment of the present disclosure.

FIG. 4 shows a TCAM structure according to an embodiment of the present disclosure.

Referring to FIG. 4, the TCAM according to the present embodiment includes a cell array unit 100, a precharge unit 200 and a data input/output unit 300.

The cell array unit 100 includes a plurality of match lines ($ML_0$, $ML_1$) running in a first direction, a plurality of bit line pairs (($BLB_0$, $BL_0$), ($BLB_1$, $BL_1$)) extending in a second direction intersecting the first direction, and a plurality of TCAM cells ((CL[00], CL[01], CL[02]), (CL[10], CL[11], CL[12])), each including two SR-FTJs (F1, F2) connected between a corresponding match line of the plurality of match lines ($ML_0$, $ML_1$) and a corresponding bit line pair of the plurality of bit line pairs (($BLB_0$, $BL_0$), ($BLB_1$, $BL_1$), ($BLB_2$, $BL_2$)).

In each of the plurality of TCAM cells ((CL[00], CL[01], CL[02]), (CL[10], CL[11], CL[12])), the first SR-FTJ (F1) is connected between a corresponding match line ($ML_0$, $ML_1$) and a corresponding bit line bar ($BLB_0$, $BLB_1$, $BLB_2$), and the second SR-FTJ (F2) is connected between a corresponding match line ($ML_0$, $ML_1$) and a corresponding bit line ($BL_0$, $BL_1$, $BL_2$). That is, one ends of the first SR-FTJ (F1) and the second SR-FTJ (F2) are commonly connected to a corresponding match line ($ML_0$, $ML_1$), while the other ends are separately connected to a corresponding bit line bar ($BLB_0$, $BLB_1$, $BLB_2$) or a corresponding bit line ($BL_0$, $BL_1$, $BL_2$).

Here, as an example, a case is illustrated in which six TCAM cells (CL) are arranged in a 2×3 form in the cell array unit 100. Accordingly, two match lines ($ML_0$, $ML_1$) running in the first direction and three bit line pairs (($BLB_0$, $BL_0$), ($BLB_1$, $BL_1$), (($BLB_2$, $BL_2$)) running in the second direction were arranged. Here, for convenience of explanation, six TCAM cells (CL) arranged in a 2×3 form were divided into an 11th TCAM cell (CL[00]) to a 23rd TCAM cell (CL[12]) according to the arranged position.

The precharge unit 200 includes a plurality of precharge transistors ($PT_0$, $PT_1$), each connected between a power supply voltage ($V_{DD}$) and a corresponding match line of the plurality of match lines ($ML_0$, $ML_1$) and having a gate to which a precharge signal (PRE) is applied. Here, when the precharge signal (PRE) applied to the gate is deactivated in a precharge step of a search operation to be described later, each of the plurality of precharge transistors ($PT_0$, $PT_1$) is activated and applies the power supply voltage ($V_{DD}$) to the corresponding match line, to precharge the corresponding match line to the power supply voltage ($V_{DD}$) level. The plurality of precharge transistors ($PT_0$, $PT_1$) may be implemented with, for example, PMOS transistors. Here, the power supply voltage ($V_{DD}$) has a voltage level between the write voltage ($V_W$) and the ground voltage.

Meanwhile, the data input/output unit 300 includes a source line (ScL), and a plurality of access transistor pairs connected between the source line (ScL) and a corresponding bit line pairs (($BLB_0$, $BL_0$), ($BLB_1$, $BL_1$), (($BLB_2$, $BL_2$)) of the plurality of bit line pairs (($BLB_0$, $BL_0$), ($BLB_1$, $BL_1$), (($BLB_2$, $BL_2$)).

Here, each of the plurality of access transistor pairs comprises two access transistors (T1, T2), wherein the first access transistor (T1) of the two access transistors (T1, T2) is connected between the corresponding bit line bars ($BLB_0$, $BLB_1$, $BLB_2$) and the source line (ScL), and has a gate to which a search line ($SL_0$, $SL_1$, $SL_2$) of a corresponding search line pairs among a plurality of search line pairs (($SL_0$, $SLB_0$), ($SL_1$, $SLB_1$), (($SL_2$, $SLB_2$)) is connected. In addition, the second access transistor (T2) is connected between the corresponding bit lines ($BL_0$, $BL_1$, $BL_2$) and the source line (ScL), and has a gate to which a search line bar ($SLB_0$, $SLB_1$, $SLB_2$) of a corresponding search line pairs among the plurality of search line pairs (($SL_0$, $SLB_0$), ($SL_1$, $SLB_1$), (($SL_2$, $SLB_2$)) is connected.

Accordingly, in each of the plurality of access transistor pairs of the data input/output unit 300, the first access transistor (T1) may electrically connect or disconnect a corresponding bit line bar ($BLB_0$, $BLB_1$, $BLB_2$) and the source line (ScL) according to data applied to a corresponding search line ($SL_0$, $SL_1$, $SL_2$), so that the voltage level of the corresponding bit line bar ($BLB_0$, $BLB_1$, $BLB_2$) maintains the previous level or drops to the ground voltage level (here, 0V as an example). Similarly, the second access transistor (T2) may electrically connect or disconnect a corresponding bit line ($BL_0$, $BL_1$, $BL_2$) and the source line (ScL) according to data applied to a corresponding search line bar ($SLB_0$, $SLB_1$, $SLB_2$), so that the voltage level of the corresponding bit line ($BL_0$, $BL_1$, $BL_2$) maintains the previous level or drops to the ground voltage level. Here, the first and second access transistors (T1, T2) may be implemented with, for example, NMOS transistors.

As described above, in the present embodiment, each of the plurality of TCAM cells ((CL[00], CL[01], CL[02]), (CL[10], CL[11], CL[12])) of the cell array unit 100 is configured to include only two SR-FTJs (F1, F2), and the two SR-FTJs (F1, F2) can have a high resistance state (HRS) and a low resistance state (LRS), respectively. Accordingly, since data "X" as well as "0" and "1" can be stored according to the combination of resistance states of the two SR-FTJs (F1, F2), it can be implemented as an ultra-small TCAM.

In addition, since it includes only one precharge transistor ($PT_0$, $PT_1$) corresponding to each of the plurality of match lines ($ML_0$, $ML_1$), and the data input/output unit 300 has only an access transistor pair corresponding to each of the plurality of bit line pairs (($BLB_0$, $BL_0$), ($BLB_1$, $BL_1$), (($BLB_2$, $BL_2$)), the size of the TCAM of present embodiment can be implemented in a smaller size.

Figure 5:
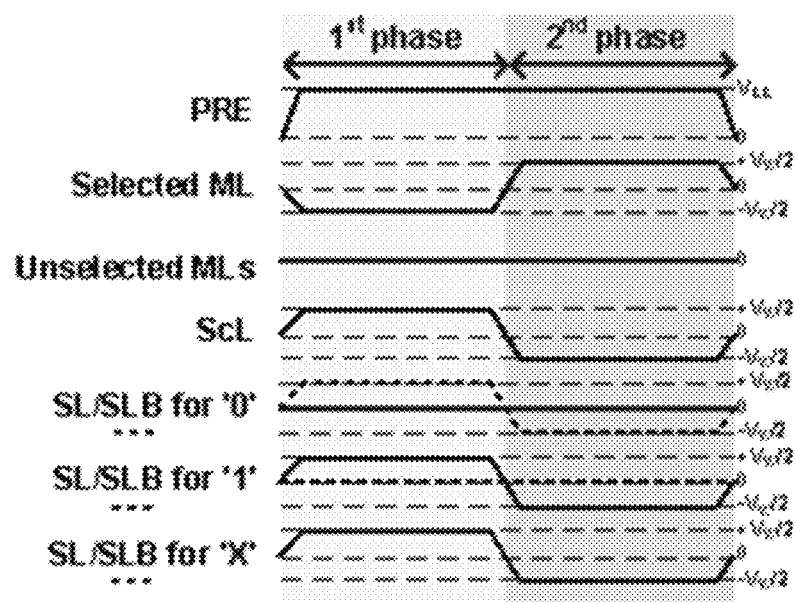
FIG. 5 shows a timing diagram for explaining a write operation of the TCAM according to the present embodiment.
Figure 6:
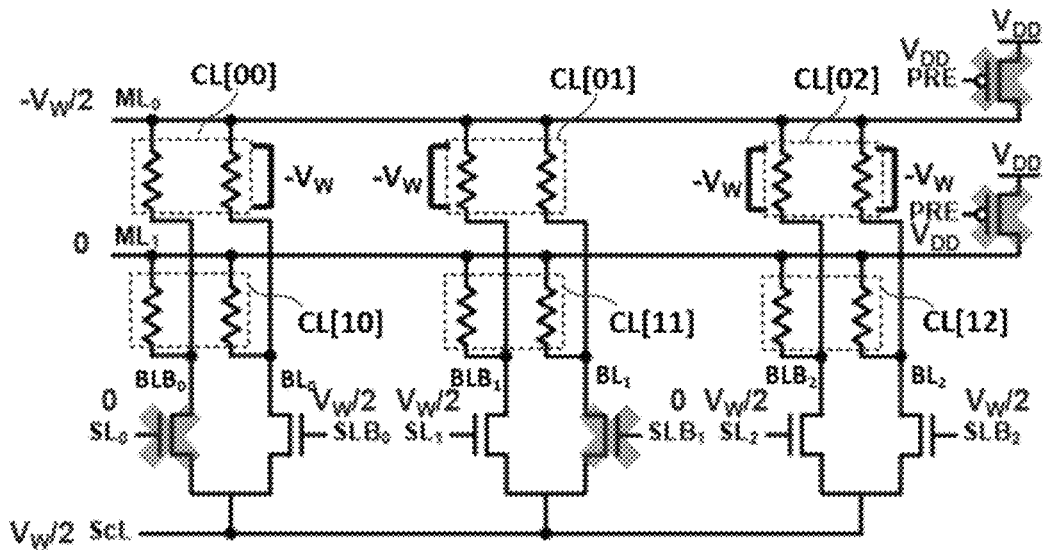
FIG. 6 and FIG. 7 are diagrams for explaining a write operation of the TCAM according to the present embodiment.
Figure 7:
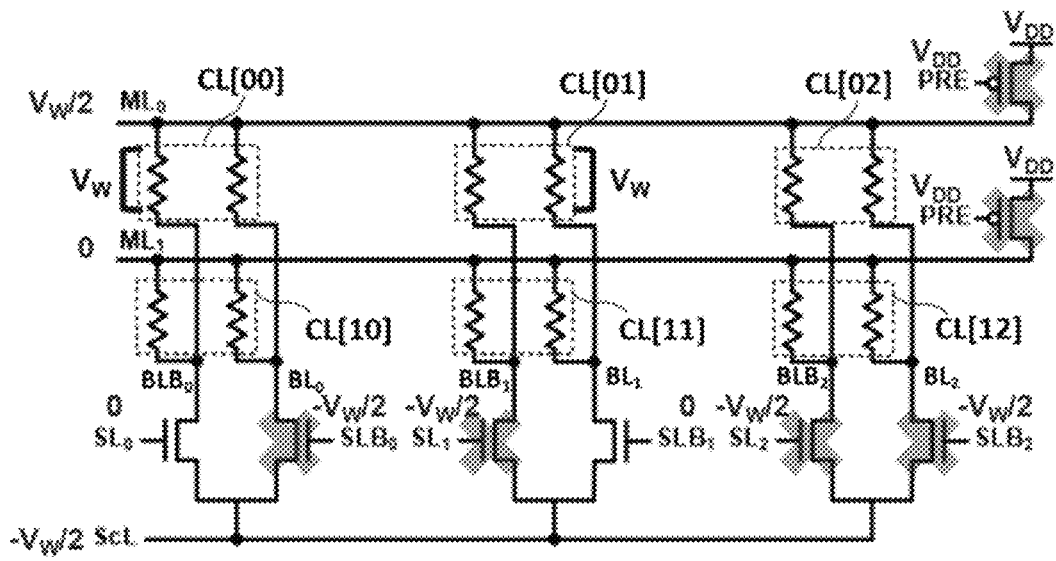

FIG. 5 shows a timing diagram for explaining a write operation of the TCAM according to the present embodiment, and FIG. 6 and FIG. 7 are diagrams for explaining a write operation of the TCAM according to the present embodiment.

Here too, a case was shown in which 6 TCAM cells (CL[ ]) are arranged in a 2×3 form in the TCAM array, and it is assumed that data "0", "1" and "X" are written to the 11th TCAM cell (CL[00]), the 12th TCAM cell (CL[01]), and the 13th TCAM cell (CL[02]) of the first row, respectively. In addition, here, it will be described that, assuming that the semiconductor layer 11 is formed in an N-type, two SR-FTJs (F1, F2) of the plurality of TCAM cells ((CL[00], CL[01], CL[02]), (CL[10], CL[11], CL[12])) have a high resistance state (HRS) when a negative write voltage ($-V_W$) is applied, and a low resistance state (LRS) when a positive write voltage ($V_W$) is applied.

In addition, in the present embodiment, it is assumed that when the first SR-FTJ (F1) connected to the bit line bar ($BLB_0$, $BLB_1$, $BLB_2$) has a low resistance state (LRS) and the second SR-FTJ (F2) connected to the bit line ($BL_0$, $BL_1$, $BL_2$) has a high resistance state (HRS), data "0" is written to the corresponding TCAM cell, and when the first SR-FTJ (F1) has a high resistance state (HRS) while the second SR-FTJ (F2) has a low resistance state (LRS), data "1" is written. In addition, it is assumed that when the first and second SR-FTJs (F1, F2) both have the high resistance state (HRS), data "X" is written.

Here, for convenience of explanation, six TCAM cells (CL) arranged in a 2×3 form are divided into an 11th TCAM cell (CL[00]) to a 23rd TCAM cell (CL[12]) according to the arranged position. In addition, it is assumed that data "0", "1" and "X" are written to the 11th TCAM cell (CL[00]), the 12th TCAM cell (CL[01]), and the 13th TCAM cell (CL[02]) of the first row, respectively.

Referring to FIG. 5, the write operation of the TCAM according to the present embodiment is divided into first and second phases ($1^{st}$ phase, $2^{nd}$ phase). Here, the $1^{st}$ phase causes the corresponding SR-FTJs (F1, F2) to have a high resistance state (HRS) according to the data to be stored in the TCAM cell ((CL[00], CL[01], CL[02]), (CL[10], CL[11], CL[12])), and the $2^{nd}$ phase causes the corresponding SR-FTJs (F1, F2) to have a low resistance state (LRS).

FIG. 6 is a diagram for explaining the $1^{st}$ phase of the write operation of the TCAM, and FIG. 7 is a diagram for explaining the $2^{nd}$ phase of the write operation of the TCAM.

Referring to FIG. 5 and FIG. 6, in the Pt phase of the write operation, a match line ($ML_0$) corresponding to an address applied with data is selected to select TCAM cells (CL[00], CL[01], CL[02]) to which data is to be written in row units, and a voltage of $-V_W/2$ level is applied to the selected match line ($ML_0$). That is, a voltage of half the write voltage is negatively applied. However, the remaining unselected match line ($ML_1$) is maintained at a ground voltage (e.g., 0V) level. In addition, a voltage of $V_W/2$ level is applied to the source line (ScL), and the precharge signal (PRE) is deactivated to the power supply voltage ($V_{DD}$) level.

Meanwhile, since it is assumed that data "0", "1" and "X" are written to the 11th TCAM cell (CL[00]), the 12th TCAM cell (CL[01]), and the 13th TCAM cell (CL[02]) of the first row, respectively, a voltage level of 0V and a voltage of $V_W/2$ level equal to that of the source line (ScL) are applied respectively, to the gates of the first and second access transistors (T1, T2) of the first access transistor pair corresponding to the 11th TCAM cell (CL[00]) through the corresponding first search line pair ($SL_0$, $SLB_0$). In addition, to the gates of the first and second access transistors (T1, T2) of the second access transistor pair corresponding to the 12th TCAM cell (CL[01]), a voltage of $V_W/2$ and a voltage of 0V are respectively applied through the corresponding second search line pair ($SL_1$, $SLB_1$), and to both the gates of the first and second access transistors (T1, T2) of the third access transistor pair corresponding to the 13th TCAM cell (CL[02]), a voltage of $V_W/2$ is applied through the corresponding third search line pair ($SL_2$, $SLB_2$).

In response to the precharge signal (PRE) deactivated to the power supply voltage ($V_{DD}$) level, the precharge transistors ($PT_0$, $PT_1$) are turned off.

The first access transistor (T1) of the first access transistor pair and the second access transistor (T2) of the second access transistor pair are turned off according to a voltage level of 0V applied to the gate. Accordingly, the first bit line bar ($BLB_0$) and the second bit line ($BL_1$) are electrically disconnected from the source line (ScL). On the other hand, the second access transistor (T2) of the first of access transistor pair, the first access transistor (T1) of the second access transistor pair and the first and second access transistors (T1, T2) of the third access transistor pair are turned on according to the $V_W/2$ voltage level applied to the gate, and the first and third bit lines ($BL_0$, $BL_2$) and the second and third bit line bars ($BLB_1$, $BLB_2$) are electrically connected to the source line (ScL).

Accordingly, to the second SR-FTJ (F2) of the 11th TCAM cell (CL[00]), the first SR-FTJ (F1) of the 12th TCAM cell (CL[01]) and the first and second SR-FTJs (F1, F2) of the 13th TCAM cell (CL[02]), $-V_W$ voltage is applied to the both ends by $-V_W/2$ voltage applied to the first match line ($ML_0$) and $V_W/2$ voltage applied to the first bit line ($BL_0$), the second bit line bar ($BLB_1$), and the third bit line pair ($BLB_2$, $BL_2$), so the second SR-FTJ (F2) of the 11th TCAM cell (CL[00]), the first SR-FTJ (F1) of the 12th TCAM cell (CL[01]), and the first and second SR-FTJs (F1, F2) of the 13th TCAM cell (CL[02]) have a high resistance state (HRS).

At this time, since the first access transistor (T1) of the first access transistor pair and the second access transistor (T2) of the second access transistor pair are turned off, and the other, unselected match line ($ML_1$) has a voltage level of 0V, in the first SR-FTJ (F1) of the 11th TCAM cell (CL[00]) and the second SR-FTJ (F2) of the 12th TCAM cell (CL[01]), only $-V_W/2$ voltage is applied to both ends, so that no change in state occurs. In addition, even when the first SR-FTJ (F1) of the 11th TCAM cell (CL[00]) and the second SR-FTJ (F2) of the 12th TCAM cell (CL[01]) are applied with $-V_W/2$ voltage at both ends, a reverse current in the direction of the first match line ($ML_0$) does not flow according to the rectifying characteristic of the SR-FTJ.

Meanwhile, as the first bit line bar ($BLB_0$) and the second bit line ($BL_1$) are not connected to the source line (ScL), and the first SR-FTJ (F1) of the 11th TCAM cell (CL[00]) and the second SR-FTJ (F2) of the 12th TCAM cell (CL[01]) operate as rectifying elements, in the first SR-FTJ (F1) of the 21st TCAM cell (CL[10]) and the second SR-FTJ (F2) of the 22nd TCAM cell (CL[11]) connected to the unselected second match line ($ML_1$), the voltage difference between the two ends is negligible, so that no change in state occurs.

In addition, since the first bit line ($BL_0$), the second bit line bar ($BLB_1$) and the third bit line pair ($BLB_2$, $BL_2$) are connected to the source line (ScL), and thus have a voltage level of $V_W/2$, while the other, unselected second match line ($ML_1$) has a voltage level of 0V, only $-V_W/2$ voltage is applied to both ends of the second SR-FTJ (F2) of the 21st TCAM cell (CL[10]), the first SR-FTJ (F1) of the 22nd TCAM cell (CL[11]) and the first and second SR-FTJs (F1, F2) of the 23rd TCAM cell (CL[12]), so that no change in state occurs.

As a result, in the $1^{st}$ phase of the write operation, only the second SR-FTJ (F2) of the 11th TCAM cell (CL[00]) and the first SR-FTJ (F1) of the 12th TCAM cell (CL[01]), and the first and second SR-FTJs (F1, F2) of the 13th TCAM cell (CL[02]) have a high resistance state (HRS).

Referring to FIG. 5 and FIG. 7, in the $2^{nd}$ phase of the write operation, a voltage of $V_W/2$ level is applied to the selected match line ($ML_0$), and a voltage of $-V_W/2$ level is applied to the source line (ScL). That is, the voltage level of each of the match line ($ML_0$) and the source line (ScL) is applied with the opposite polarity to that in the $1^{st}$ phase.

In addition, the remaining, unselected match line ($ML_1$) is maintained at the ground voltage (e.g., 0V) level, and the precharge signal (PRE) also maintains an inactive state at the level of the power supply voltage ($V_{DD}$).

In addition, to the gates of the first and second access transistors (T1, T2) of the first access transistor pair corresponding to the 11th TCAM cell (CL[00]), a voltage level of 0V and a voltage of $-V_W/2$ level equal to that of the source line (ScL) are applied, respectively, through the corresponding first search line pair ($SL_0$, $SLB_0$), to the gates of the first and second access transistors (T1, T2) of the second access transistor pair corresponding to the 12th TCAM cell (CL[01]), a voltage of $-V_W/2$ and a voltage of 0V are respectively applied through the corresponding second search line pair ($SL_1$, $SLB_1$), and to both the gates of the first and second access transistors (T1, T2) of the third access transistor pair corresponding to the 13th TCAM cell (CL[02]), a voltage of $-V_W/2$ is applied through the corresponding third search line pair ($SL_2$, $SLB_2$).

At this time, the bodies of the first and second access transistors (T1, T2) of all access transistor pairs are configured in common, and $-V_W/2$ voltage is applied as a body voltage so that $-V_W/2$ voltage can be applied to the gate. That is, in the $1^{st}$ phase, a voltage of 0V is applied to the bodies of the first and second access transistors (T1, T2), whereas in the $2^{nd}$ phase, $-V_W/2$ voltage is applied to the bodies.

Since a voltage level of 0V is applied to the gates of the first access transistor (T1) of the first access transistor pair and the second access transistor (T2) of the second access transistor pair as in the $1^{st}$ phase, but the body voltage is applied as $-V_W/2$ voltage, the first access transistor (T1) of the first access transistor pair and the second access transistor (T2) of the second access transistor pair are turned on, thereby electrically connecting the first bit line bar ($BLB_0$) and the second bit line ($BL_1$) to the source line (ScL). Accordingly, the first bit line bar ($BLB_0$) and the second bit line ($BL_1$) have a voltage level of $-V_W/2$.

On the other hand, since a voltage level of $-V_W/2$ equal to the body voltage is applied to the gates of the second access transistor (T2) of the first access transistor pair, the first access transistor (T1) of the second access transistor pair, and the first and second access transistors (T1, T2) of the third access transistor pair, the second access transistor (T2) of the first access transistor pair, the first access transistor (T1) of the second access transistor pair, and the first and second access transistors (T1, T2) of the third access transistor pair are turned off, thereby blocking an electrical connection between the source line (ScL) and each of the first bit line ($BL_0$), the second bit line bar ($BLB_1$) and the third bit line pair ($BLB_2$, $BL_2$).

Accordingly, a voltage of $V_W$ is applied to both ends of the first SR-FTJ (F1) of the 11th TCAM cell (CL[00]) and the second SR-FTJ (F2) of the 12th TCAM cell (CL[01]) to have a low resistance state (LRS), while a voltage of $V_W/2$ is applied to both ends of the second SR-FTJ (F2) of the 11th TCAM cell (CL[00]), the first SR-FTJ (F1) of the 12th TCAM cell (CL[01]) and the first and second SR-FTJs (F1, F2) of the 13th TCAM cell (CL[02]), so that no state change occurs.

Meanwhile, a voltage of $V_W/2$ is also applied to both ends of the first SR-FTJ (F1) of the 21st TCAM cell (CL[10]) and the second SR-FTJ (F2) of the 22nd TCAM cell (CL[11]), so that a state change does not occur, and a voltage of $-V_W/2$ or more is applied to both ends of the second SR-FTJ (F2) of the 21st TCAM cell (CL[10]), the first SR-FTJ (F1) of the 22nd TCAM cell (CL[11]) and the first and second SR-FTJs (F1, F2) of the 13th TCAM cell (CL[02]), so that a state change does not occur. In addition, According to the rectifying characteristics of the SR-FTJ (F2) of the 21st TCAM cell (CL[10]), the first SR-FTJ (F1) of the 22nd TCAM cell (CL[11]) and the first and second SR-FTJs (F1, F2) of the 13th TCAM cell (CL[02]), a reverse current does not flow.

Accordingly, it is possible to make the first and second SR-FTJs (F1, F2) of each of the TCAM cells (CL[00], CL[01], CL[02]) connected to the selected match line (ML$_0$) have a high resistance state (HRS) or a low resistance state (LRS), without causing write disturbance through the $1^{st}$ and $2^{nd}$ phases.

Figure 8:
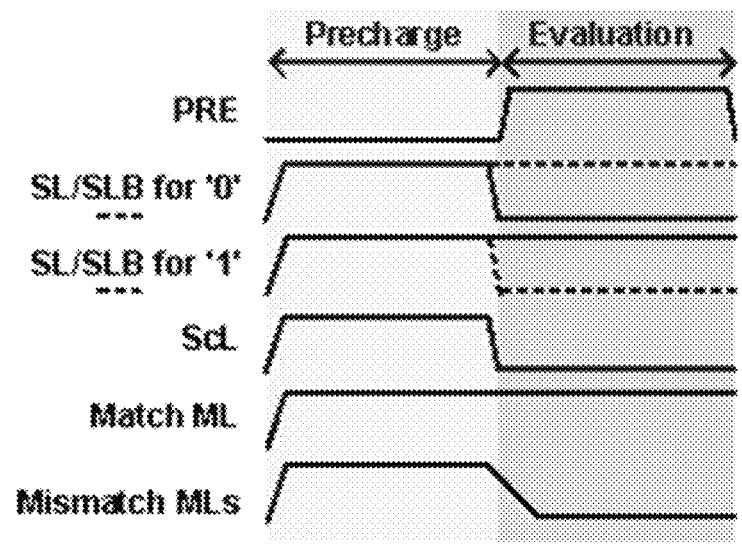
FIG. 8 shows a timing diagram for explaining a search operation of the TCAM according to the present embodiment.
Figure 9:
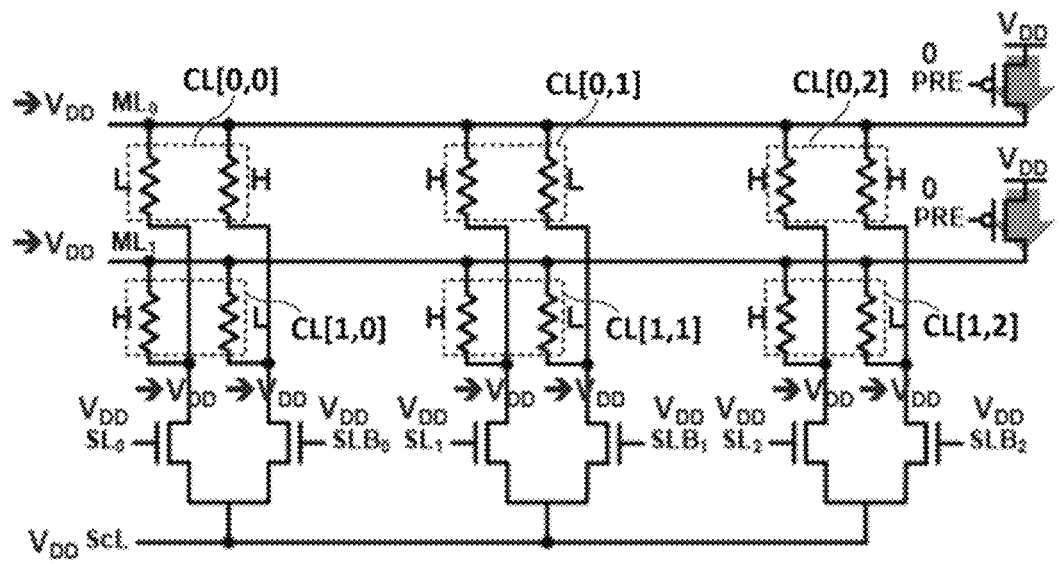
FIG. 9 and FIG. 10 are diagrams for explaining a search operation of the TCAM according to the present embodiment.
Figure 10:
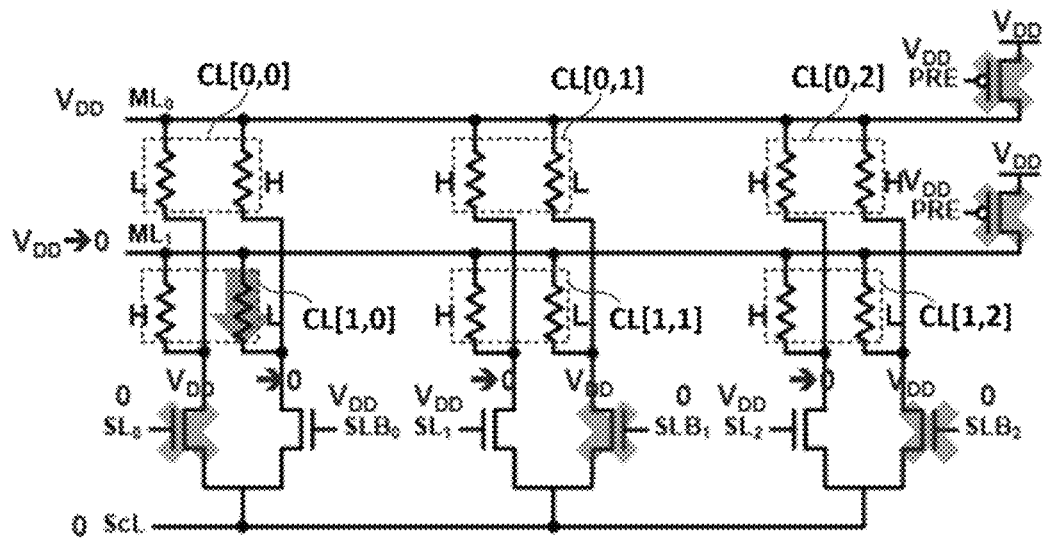
Figure 11:
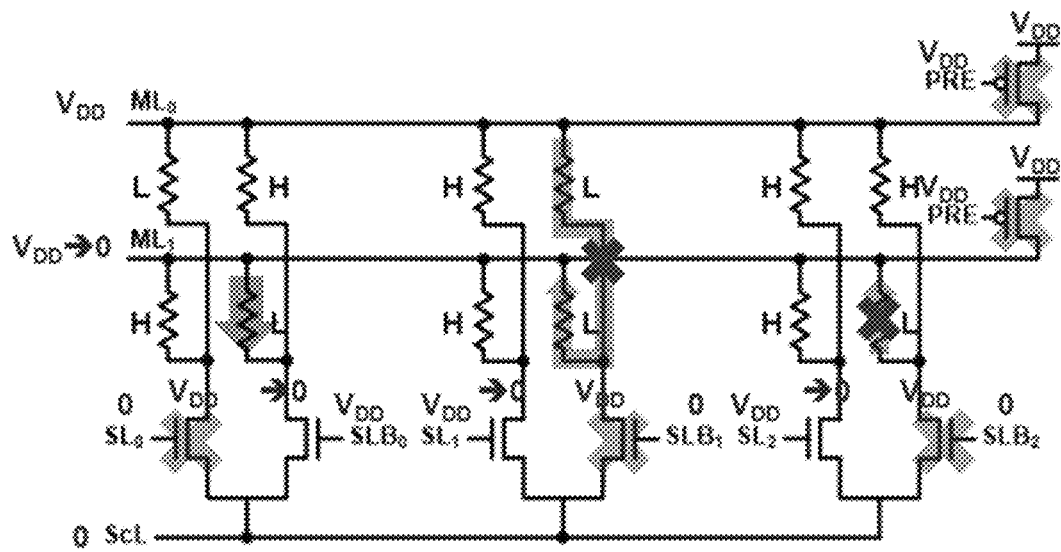
FIG. 11 is a diagram for explaining a sneak current prevention characteristic of the TCAM according to the present embodiment.

FIG. 8 shows a timing diagram for explaining a search operation of the TCAM according to the present embodiment, FIGS. 9 and 10 are diagrams for explaining a search operation of the TCAM according to the present embodiment, and FIG. 11 is a diagram for explaining a sneak current prevention characteristic of the TCAM according to the present embodiment.

Here, according to the embodiment of FIGS. 5 to 7, it is assumed that data "0", "1" and "X" are written to three TCAM cells (CL[00], CL[01], CL[02]) in the first row, respectively, and that data "1", "1", and "1" are written to three TCAM cells (CL[10], CL[11], CL[12]) in the second row, respectively, and a case will be described in which 3-bit data of "011" is searched.

Referring to FIG. 8, a search operation also consists of two phases: a precharge phase shown in FIG. 9 and an evaluation phase shown in FIG. 10.

In first describing the precharge phase with reference to FIGS. 8 and 9, in the precharge phase, the precharge signal (PRE) is activated to a ground voltage level. Accordingly, a plurality of precharge transistors (PT$_0$, PT$_1$) of the precharge unit 200 are all turned on, and each of the turned-on plurality of precharge transistors (PT$_0$, PT$_1$) precharges the corresponding match line (ML$_0$, ML$_1$) to the power supply voltage ($V_{DD}$) level.

In addition, the power supply voltage ($V_{DD}$) is applied to the source line (ScL), and the power supply voltage ($V_{DD}$) is applied to the plurality of search line pairs ((SL$_0$, SLB$_0$), (SL$_1$, SLB$_1$), (SL$_2$, SLB$_2$)). Accordingly, all the first and second access transistors (T1, T2) of each of the plurality of access transistor pairs are turned on, so that the plurality of bit line pairs ((BLB$_0$, BL$_0$), (BLB$_1$, BL$_1$), (BLB$_2$, BL$_2$)) also become the power supply voltage ($V_{DD}$).

That is, in the precharge phase, the plurality of match lines (ML$_0$, ML$_1$) and the plurality of bit line pairs ((BLB$_0$, BL$_0$), (BLB$_1$, BL$_1$), (BLB$_2$, BL$_2$)) are all precharged to the power supply voltage ($V_{DD}$) level.

Meanwhile, in describing an operation of the evaluation phase with reference to FIGS. 8 and 10, in the evaluation phase, the precharge signal (PRE) is deactivated to the power supply voltage ($V_{DD}$), so that the plurality of precharge transistors (PT$_0$, PT$_1$) are turned off, and a ground voltage is applied to the source line (ScL).

In addition, a voltage according to a corresponding bit value of data to be searched is applied to the plurality of search line pairs ((SL$_0$, SLB$_0$), (SL$_1$, SLB$_1$), (SL$_2$, SLB$_2$)). Here, since the case of search data "011" was assumed, a ground voltage of 0V is applied to a first search line (SL$_0$) of the first search line pair (SL$_0$, SLB$_0$), a power supply voltage ($V_{DD}$) is applied to the first search line bar (SLB$_0$), a power supply voltage ($V_{DD}$) is applied to the second and third search lines (SL$_1$, SL$_2$) of the second and third search line pairs ((SL$_1$, SLB$_1$), (SL$_2$, SLB$_2$)), and a ground voltage is applied to the second and third search line bars (SLB$_1$, SLB$_2$).

The first access transistor (T1) of the first access transistor pair and the second access transistors (T2) of the second and third access transistor pairs are turned off in response to the ground voltage applied to their gates, and the second access transistor (T2) of the first access transistor pair and the first access transistors (T1) of the second and third access transistor pairs are turned on in response to the power supply voltage ($V_{DD}$) applied to their gate. During the search operation, the body voltages of the first and second access transistors (T1, T2) are all 0V.

Since the first access transistor (T1) of the first access transistor pair and the second access transistors (T2) of the second and third access transistor pairs are in a turned-off state, in the first SR-FTJs (F1) of the 11th and 21st TCAM cells (CL[00], CL[10]), and the second SR-FTJs (F2) of the 12th, 13th, 22nd and 23rd TCAM cells (CL[01], CL[02], CL[11], CL[12]), no current flows regardless of the high resistance state (HRS) or the low resistance state (LRS) because a current path to the source line (ScL) is not formed.

In addition, since the second SR-FTJ (F2) of the 11th TCAM cell (CL[00]) connected to the first match line (ML$_0$) and the first SR-FTJs (F1) of the 12th and 13th TCAM cells (CL[01], CL[02]) are all in a high resistance state (HRS), no current flows from the first match line (ML$_0$) to the first bit line (BL$_0$) and the second and third bit line bars (BLB$_1$, BLB$_2$). Accordingly, the first match line (ML$_0$) maintains the precharged power supply voltage ($V_{DD}$) level.

Meanwhile, since the first SR-FTJs (F1) of the 22nd and 23rd TCAM cells (CL[11], CL[12]) connected to the second match line (ML$_1$) are all in a high resistance state (HRS), no current flows from the second match line (ML$_1$) to the second and third bit line bars (BLB$_1$, BLB$_2$) through the first SR-FTJs (F1) of the 22nd and 23rd TCAM cells (CL[11], CL[12]). However, the second SR-FTJ (F2) of the 21st TCAM cell (CL[10]) is in a low resistance state (LRS). Accordingly, a current path is formed from the second match line (ML$_1$) to the source line (ScL) through the first bit line (BL$_0$), and thus the voltage level of the second match line (ML$_1$) drops. In the second match line (ML$_1$), the voltage level to drop may vary according to a resistance value of the second SR-FTJ (F2) of the 21st TCAM cell (CL[10]).

That is, the first match line (ML$_0$) corresponding to the TCAM cells (CL[00], CL[01], CL[02]) in the first row in which "0", "1" and "X" matching the search data "011" are stored maintains the precharged voltage level, while in the second match line (ML$_1$) corresponding to the TCAM cells (CL[10], CL[11], CL[12]) in the second row in which "1", "1", and "1" are stored, its voltage drops. As a result, in a plurality of sensing circuits of the TCAM array, an output may be output as an address matched to data to which an address of a row having a power supply voltage ($V_{DD}$) is applied.

Referring to FIG. 11, in the case of the second SR-FTJ (F2) of the 22nd TCAM cell (CL[11]) in the evaluation phase, as the voltage level of the second match line ($ML_1$) drops, a negative voltage is applied to both ends through the second SR-FTJ (F2) of the 12th TCAM cell (CL[01]) from the precharged first match line ($ML_0$) and the corresponding bit line ($BL_1$). If it is a general FTJ rather than an SR-FTJ, a sneak current flows from the first match line ($ML_0$) to the second match line ($ML_1$) by the negative voltage applied to the both ends, but in the present disclosure, as an SR-FTJ having a unidirectional rectifying characteristic is used, the second SR-FTJ (F2) blocks the sneak current from the first match line ($ML_0$) to the second match line ($ML_1$), so that it is possible to prevent a problem in which the voltage level of the first match line ($ML_0$) is unintentionally dropped.

Also in the case of the second SR-FTJ (F2) of the 23rd TCAM cell (CL[12]), as the corresponding bit line ($BL_2$) is precharged to the power supply voltage ($V_{DD}$) level, and the voltage level of the second match line ($ML_1$) drops, a negative voltage is applied to the both ends, but no current flows to the second match line ($ML_1$) according to the rectifying characteristic of the second SR-FTJ (F2).

Meanwhile, although not shown here, each of the plurality of match lines ($ML_0$, $ML_1$) having one end connected to the corresponding precharge transistor ($PT_0$, $PT_1$) may have an inverter (not shown) connected to the other end, to accurately detect a voltage level change of the match lines ($ML_0$, $ML_1$).

As described above, in the TCAM according to the present embodiment, since each TCAM cell has the minimum number of elements including only two nonvolatile SR-FTJs (F1, F2) having a high on/off ratio, energy consumption can be reduced, and it can be manufactured in a small size by high integration in a small area, and it is possible to prevent write disturbance from occurring.

While the present disclosure is described with reference to embodiments illustrated in the drawings, these are provided as examples only, and the person having ordinary skill in the art would understand that many variations and other equivalent embodiments can be derived from the embodiments described herein.

Therefore, the true technical scope of the present disclosure is to be defined by the technical spirit set forth in the appended scope of claims.

What is claimed is:

1. A ternary content addressable memory (TCAM) comprising:
a cell array unit having a plurality of TCAM cells, each comprising two self-rectifying ferroelectric tunnel junction elements (hereinafter, SR-FTJ) connected between a corresponding match line of a plurality of match lines extending in a first direction and a corresponding bit line pair of a plurality of bit line pairs extending in a second direction intersecting the first direction;
a precharge unit precharging a corresponding match line of the plurality of match lines to a power supply voltage level in response to a precharge signal; and
a data input/output unit having a plurality of access transistor pairs electrically connecting or disconnecting a corresponding bit line pair among the plurality of bit line pairs and a source line, in response to a voltage applied through a corresponding search line pair among a plurality of search line pairs according to data to be written or searched.

2. The TCAM according to claim 1,
wherein each of the plurality of TCAM cells includes:
a first SR-FTJ connected between a corresponding match line and a bit line bar of a corresponding bit line pair; and
a second SR-FTJ connected between a corresponding match line and a bit line of a corresponding bit line pair.

3. The TCAM according to claim 2,
wherein in each of the plurality of TCAM cells,
when data "0" is stored by a write operation, the first SR-FTJ has a low resistance state (LRS) and the second SR-FTJ has a high resistance state (HRS), and
when data "1" is stored, the first SR-FTJ has a high resistance state and the second SR-FTJ has a low resistance state, and
when data "X" (don't care) is stored, both the first and second FeFETs have a high resistance state.

4. The TCAM according to claim 3,
wherein each of the plurality of access transistor pairs includes:
a first access transistor connected between a bit line bar of a corresponding bit line pair and the source line and having a gate connected with a search line of a corresponding search line pair; and
a second access transistor connected between a bit line of a corresponding bit line pair and the source line and having a gate connected with a search line bar of a corresponding search line pair.

5. The TCAM according to claim 4,
wherein in a $1^{st}$ phase of a write operation divided into the $1^{st}$ phase and a $2^{nd}$ phase, the TCAM selects a match line corresponding to an address applied together with data and applies a voltage of $-V_W/2$ based on a write voltage ($V_W$), and applies a ground voltage to unselected match lines, and applies a voltage of $V_W/2$ to the source line, so that the first SR-FTJ or the second SR-FTJ of the TCAM cell corresponding to the selected match among the plurality of TCAM cells has a high resistance state according to a voltage level applied through a corresponding search line pair.

6. The TCAM according to claim 5,
wherein in the TCAM,
when a ground voltage and a voltage of $V_W/2$ are respectively applied to a search line and a search line bar of a corresponding search line pair among the plurality of search line pairs, the second SR-FTJ of a corresponding TCAM cell of a plurality of TCAM cells connected to the selected match line has a high resistance state,
when a voltage of $V_W/2$ and a ground voltage are respectively applied to the search line and the search line bar of a corresponding search line pair, the first SR-FTJ of the corresponding TCAM cell connected to the selected match line has a high resistance state, and
when a voltage of $V_W/2$ is applied to each of the search line and the search line bar of a corresponding search line pair, the first SR-FTJ of the corresponding TCAM cell connected to the selected match line has a high resistance state.

7. The TCAM according to claim 6,
wherein in the 2nd phase of the write operation, the TCAM applies a voltage of $V_W/2$ to the selected match line, a ground voltage to unselected match lines, and a voltage of $-V_W/2$ to the source line, so that the first SR-FTJ or the second SR-FTJ of the TCAM cell corresponding to the selected match among the plurality of TCAM cells has a low resistance state according to a voltage level applied through a corresponding search line pair.

8. The TCAM according to claim 7,
wherein in the TCAM,
when a ground voltage and a voltage of $-V_W/2$ are respectively applied to the search line and the search line bar of a corresponding search line pair, the first SR-FTJ of a corresponding TCAM cell of a plurality of TCAM cells connected to the selected match line has a low resistance state, and
when a voltage of $-V_W/2$ and a ground voltage are respectively applied to the search line and the search line bar of a corresponding search line pair, the second SR-FTJ of the corresponding TCAM cell connected to the selected match line has a low resistance state.

9. The TCAM according to claim 8,
wherein to the first and second SR-FTJs of the plurality of TCAM cells,
in the $1^{st}$ phase of the write operation, a ground voltage is applied as a body voltage, and in the $2^{nd}$ phase, a voltage of $-V_W/2$ is applied.

10. The TCAM according to claim 8,
wherein the precharge unit includes a plurality of precharge transistors connected between a power supply voltage and a corresponding match line of the plurality of match lines and receiving the precharge signal through gates.

11. The TCAM according to claim 10,
wherein each of the plurality of precharge transistors, in a precharge phase of a search operation, which is divided into the precharge phase and an evaluation phase, is turned on in response to the precharge signal activated to a ground voltage level to precharge a corresponding match line among the plurality of match lines to a power supply voltage level, and in the write operation and the evaluation phase, is turned off in response to the precharge signal deactivated to a power supply voltage level.

12. The TCAM according to claim 11,
wherein in the precharge phase, the TCAM applies a power supply voltage to the source line and the search line and the search line bar of each of the plurality of search line pairs, thereby precharging bit line bars and bit lines of the plurality of bit line pairs to a power supply voltage level.

13. The TCAM according to claim 12,
wherein in the evaluation phase, the TCAM applies a ground voltage to the source line, and
when the data to be searched is "0", the ground voltage and the power supply voltage are applied to the search line and the search line bar, respectively, and
when the data to be searched is "1", the power supply voltage and the ground voltage are applied to the search line and the search line bar, respectively.

* * * * *